(12) United States Patent
Kim (10) Patent No.: US 8,502,295 B2
(45) Date of Patent: Aug. 6, 2013

(54) NONVOLATILE MEMORY DEVICE

(75) Inventor: Jin Gu Kim, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/252,521

(22) Filed: Oct. 4, 2011

(65) Prior Publication Data

US 2012/0086057 A1 Apr. 12, 2012

(30) Foreign Application Priority Data

Oct. 6, 2010 (KR) .................. 10-2010-0097241

(51) Int. Cl.
*H01L 29/788* (2006.01)
*H01L 29/76* (2006.01)

(52) U.S. Cl.
USPC ............. 257/315; 257/288; 257/E29.255

(58) Field of Classification Search
CPC ............ H01L 27/115; H01L 27/11521; H01L 21/28273
USPC .................. 257/288, 315, E29.255
See application file for complete search history.

(56) References Cited

U.S. PATENT DOCUMENTS

| 6,421,272 | B1 * | 7/2002 | Noguchi | 365/185.05 |
| 2006/0228859 | A1 * | 10/2006 | Willer | 438/257 |
| 2009/0021988 | A1 * | 1/2009 | Hong et al. | 365/185.29 |
| 2009/0098700 | A1 * | 4/2009 | Yang | 438/264 |

FOREIGN PATENT DOCUMENTS

| JP | 2008192905 A | 8/2008 |
| KR | 1020050037965 A | 4/2005 |
| KR | 1020060084107 A | 7/2006 |
| KR | 1020070006435 A | 1/2007 |

* cited by examiner

*Primary Examiner* — Nikolay Yushin
(74) *Attorney, Agent, or Firm* — William Park & Associates Patent Ltd.

(57) ABSTRACT

A semiconductor memory device includes a gate insulating layer formed over a semiconductor substrate; a first conductive layer pattern for select transistors and memory cells formed on the gate insulating layer; a dielectric layer formed on the first conductive layer pattern; a second conductive layer pattern formed on the dielectric layer on the first conductive layer pattern for the memory cells; and select lines made of material having lower resistance than the second conductive layer pattern and coupled to the first conductive layer pattern for the select transistors.

10 Claims, 7 Drawing Sheets

NONVOLATILE MEMORY DEVICE

CROSS-REFERENCE TO RELATED APPLICATION

Priority is claimed to Korean patent application number 10-2010-0097241 filed on Oct. 6, 2010, the entire disclosure of which is incorporated by reference herein.

BACKGROUND

Embodiments of the present invention relate generally to a nonvolatile memory device and a method of manufacturing the same and more particularly to improving the resistance of select lines and simplifying the manufacturing processes of nonvolatile memory devices.

A nonvolatile memory device, such as a NAND flash memory, includes a plurality of strings ST in a cell array region. The strings ST are described below in more detail with reference to FIG. 1, which is a circuit diagram showing the memory cell array of a NAND flash memory device.

Figure 1:
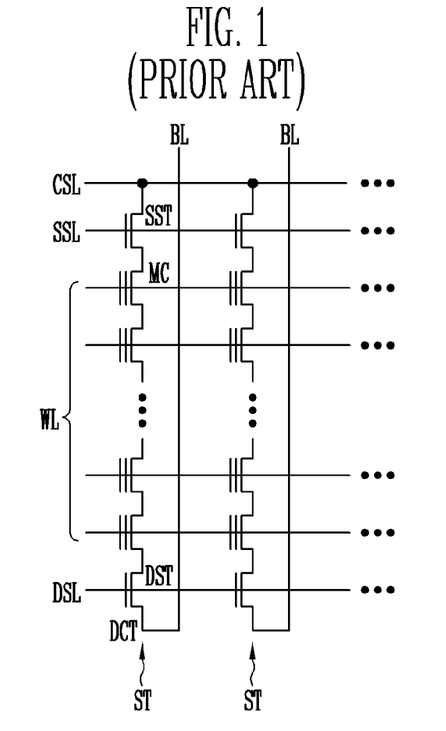
FIG. 1 is a circuit diagram showing the memory cell array of a NAND flash memory device.

Referring to FIG. 1, the memory cell array of the NAND flash memory device includes a plurality of strings ST, where each string is coupled between a common source line CSL and a drain contact DCT coupled to a bit line BL. Each of the strings ST includes a plurality of memory cells MC coupled in series between a drain select transistor DST and a source select transistor SST.

The drain select transistor DST couples the string ST to the bit line BL, and the source select transistor SST couples the string ST to the common source line CSL. The drain select transistors DST are coupled to a drain select line DSL, and the source select transistors SST are coupled to a source select line SSL. Furthermore, the memory cells MC are coupled respectively to rows of word lines WL arranged between the source select line SSL and the drain select line DSL.

Figure 2:
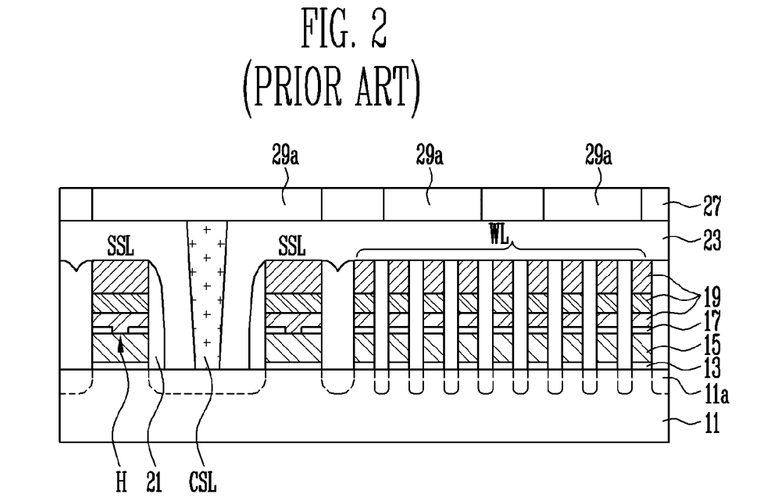
FIG. 2 is a cross-sectional view illustrating a part of a string of the NAND flash memory device.

In general, the gates of the transistors SST, DST and memory cells MC in a string ST in a NAND flash memory device are formed simultaneously by stacking the common layers and then patterning the stacked layers. FIG. 2 is a cross-sectional view showing a part of a string to describe formation of the gates in a string ST.

Referring to FIG. 2, the gates of memory cells MC coupled to respective word lines WL and the gate of a source select transistor SST coupled to a source select line SSL are formed by sequentially a first conductive layer 15, a dielectric layer 17, and a second conductive layer 19 over a gate insulating layer 13 formed over a semiconductor substrate 11 and then patterning them. Although not shown, the gate of a drain select transistor DST coupled to a drain select line DSL is formed using the same process as that used to form the gate of the source select transistor SST. It should be readily understood that the meaning of "on" and "over" in the present disclosure should be interpreted in the broadest manner such that "on" not only mean "directly on" something but also include the meaning of "on" something with an intermediate feature or a layer therebetween and that "over" not only means the meaning of "over" something may also include the meaning it is "over" something with no intermediate feature or layer therebetween (i.e., directly on something).

In each of the gates of the memory cells MC, the first conductive layer 15 is used as a floating gate into which electrons are injected or from which electrons are discharged, and the second conductive layer 19 is used as a control gate. Accordingly, in a memory cell MC, the first conductive layer 15 and the second conductive layer 19 are electrically insulated with the dielectric layer 17 interposed therebetween.

On the other hand, in the case of a source select transistor SST and the drain select transistor DST, the first conductive layer 15 and the second conductive layer 19 must be electrically coupled, because the gates of the source select transistor SST and the drain select transistor DST do not require a floating gate structure. Accordingly, when forming a source select transistor SST or a drain select transistor DST, a contact hole H, through which the first conductive layer 15 is exposed, is formed in the dielectric layer 17 by etching a region of the dielectric layer 17 prior to the stacking of the second conductive layer 19. The source select transistor SST and the drain select transistor DST are formed in this manner to correspond with the regions in which the source select line SSL and the drain select line are to be formed. Thus, the second conductive layer 19 stacked over the dielectric layer 17 having a contact hole H formed therethrough is electrically coupled to the first conductive layer 15 through the contact hole H in the region where the source select line SSL and the drain select line are to be formed.

To form a contact hole H in the dielectric layer 19 requires an additional mask process of forming the contact hole H. One mask process requires at least 6 processes including a deposition process, a cleaning process, an etch process, and so on. Thus, an additional mask process leads to more complicated manufacturing processes, which are undesirable.

After forming the gates of a string, impurity ions are implanted into the semiconductor substrate 11 between the gates to form the junctions 11a. A spacer 21 is formed on the sidewalls of the gates, and a space between the gates is filled with a first interlayer dielectric layer 23. Next, a common source line CSL is formed and coupled to the junction 11a between the neighboring source select lines SSL. Furthermore, although not shown in FIG. 2, a drain contact plug (that is, part of a drain contact) is coupled to the junction between the drain select lines. The common source line CSL and the drain contact plug may be formed by etching the first interlayer dielectric layer 23 so that the junction 11a between the source select lines SSL and the junction between the drain select lines DSL are exposed and then filling a part from which the first interlayer dielectric layer 23 has been removed with a conductive material.

After forming the common source line CSL and the drain contact plug as described above, a plurality of auxiliary lines 29a is formed. The auxiliary lines 29a may be formed by (1) forming a second interlayer dielectric layer 27 on the first interlayer dielectric layer 23 including the common source line CSL and the drain contact plug, (2) etching the parts of the second interlayer dielectric layer 27, and (3) filling the removed parts of the second interlayer dielectric layer 27 with a metal material.

Although not shown in FIG. 2, the auxiliary lines 29a are interconnected through a contact structure provided in the strapping region of a cell array region. The auxiliary lines 29a are coupled to the common source line CSL, so as to improve the resistance of the common source line CSL and the source line bouncing phenomenon.

However, increasing the loads of the source select line SSL and the drain select line DSL are becoming more difficult in light of the ongoing effort to achieve more highly integrated and smaller sized semiconductor memory devices. When the select lines are overloaded, the time to program a NAND flash memory device inevitably increases because the time taken to supply a program voltage to a specific word line is increased. Furthermore, noise may be generated because the stability of a signal is not secured.

To improve the resistance (i.e., to reduce resistance) of the select lines, a metal silicide such as cobalt silicide ($CoSi_2$)

may be used as the second conductive layer 19. A metal silicide is chiefly formed by patterning a polysilicon layer used as the second conductive layer 19, stacking a metal layer on the patterned polysilicon layer, and then performing a silidation process using an annealing process. The width of the patterned polysilicon layer is wider in the source and drain select lines SSL, DSL than in the word lines WL.

By performing an annealing process, the amount of metal from the metal layer diffused into the patterned polysilicon layer is smaller in the source and drain select lines SSL, DSL than in the word lines WL. Consequently, the thickness of the metal silicide layer in the word lines WL is thicker than the thickness of the metal silicide layer in the source and drain select lines SSL, DSL. The metal from the metal silicide layer should not be spreading to the dielectric layer 17. Therefore, the target thickness of a metal silicide layer is based on the thickness of the rather thick metal silicide layer in the word lines WL.

For this reason, improving the resistance of the source and drain select lines SSL, DSL is difficult because the metal silicide layer having a thickness enough to improve the resistance may not be formed in the source and drain select lines.

BRIEF SUMMARY

Embodiments of the present invention relate to a semiconductor memory device including a NAND flash memory device and a method of manufacturing the same, which are capable of improving resistance of select lines and also simplifying the manufacturing process.

A NAND flash memory device according to an aspect of this disclosure includes a gate insulating layer formed over a semiconductor substrate; a first conductive layer pattern for select transistors and memory cells formed on the gate insulating layer; a dielectric layer formed on the first conductive layer pattern; a second conductive layer pattern formed on the dielectric layer on the first conductive layer pattern for the memory cells; and select lines made of material having lower resistance than the second conductive layer pattern and coupled to the first conductive layer pattern for the select transistors.

A method of manufacturing a NAND flash memory device according to an aspect of this disclosure includes stacking a first conductive layer, a dielectric layer, and a second conductive layer over a semiconductor substrate; forming a first conductive layer pattern for select transistors and memory cells and a second conductive layer pattern by etching the second conductive layer, the dielectric layer, and the first conductive layer; exposing the dielectric layer by etching the second conductive layer pattern over the first conductive layer pattern for the select transistors; forming a first interlayer dielectric layer over the semiconductor substrate to fill the etched parts of the second conductive layer pattern; etching the first interlayer dielectric layer and the dielectric layer to expose the first conductive layer pattern for the select transistors; and forming select lines coupled to the first conductive layer pattern by filling the etched parts of the first interlayer dielectric layer and the dielectric layer with material having lower resistance than material of the second conductive layer pattern.

When exposing the dielectric layer by etching the second conductive layer pattern, the width of the exposed dielectric layer is identical with the width of the first conductive layer pattern for the select transistors or narrower than a width of the first conductive layer pattern for the select transistors.

The method further includes forming a spacer on the sidewalls of the second conductive layer pattern, the dielectric layer, and the first conductive layer pattern, before etching the second conductive layer pattern. The spacer and the dielectric layer are used as etch-stop layers when etching the second conductive layer pattern.

Forming a first interlayer dielectric layer over the semiconductor substrate may include forming a first insulating layer to fill the etched parts of the second conductive layer pattern, polishing the first insulating layer to expose the second conductive layer pattern, and forming a second insulating layer on the first insulating layer including the second conductive layer pattern. The method further includes changing an upper portion of the second conductive layer pattern into a metal silicide layer using a silidation process, before forming the second insulating layer. The second conductive layer is formed of a polysilicon layer.

The method further includes forming a second interlayer dielectric layer over the first interlayer dielectric layer including the select lines, etching the second interlayer dielectric layer to expose the select lines, and forming auxiliary lines coupled to the select lines by filling the etched parts of the second interlayer dielectric layer with material having lower resistance than material of the second conductive layer pattern.

The auxiliary lines and the select lines are formed of metal layers. For example, the auxiliary lines and the select lines may be made of tungsten (W), cobalt (Co), or nickel (Ni) or formed of metal silicide layers.

The method further includes forming the junctions of the select transistors by implanting impurity ions into the semiconductor substrate, after forming the first and second conductive layer patterns. The junctions are exposed when etching the first interlayer dielectric layer and the dielectric layer, and a common source line coupled to the junctions is formed simultaneously with the select lines when forming the select lines.

DESCRIPTION OF EMBODIMENTS

Hereinafter, various embodiments of the present invention are described in detail with reference to the accompanying drawings. The figures are provided to aid those of the ordinary skill in the art to understand the present invention through various embodiments described and shown herein.

The embodiments of the present invention are described with respect to a NAND flash memory device as an example device; however, it should be understood that the scope of the present invention is not limited to only the NAND flash memory devices. The scope of the present invention is directed to all types of semiconductor devices that are integrated including volatile and nonvolatile memory devices.

Figure 3:
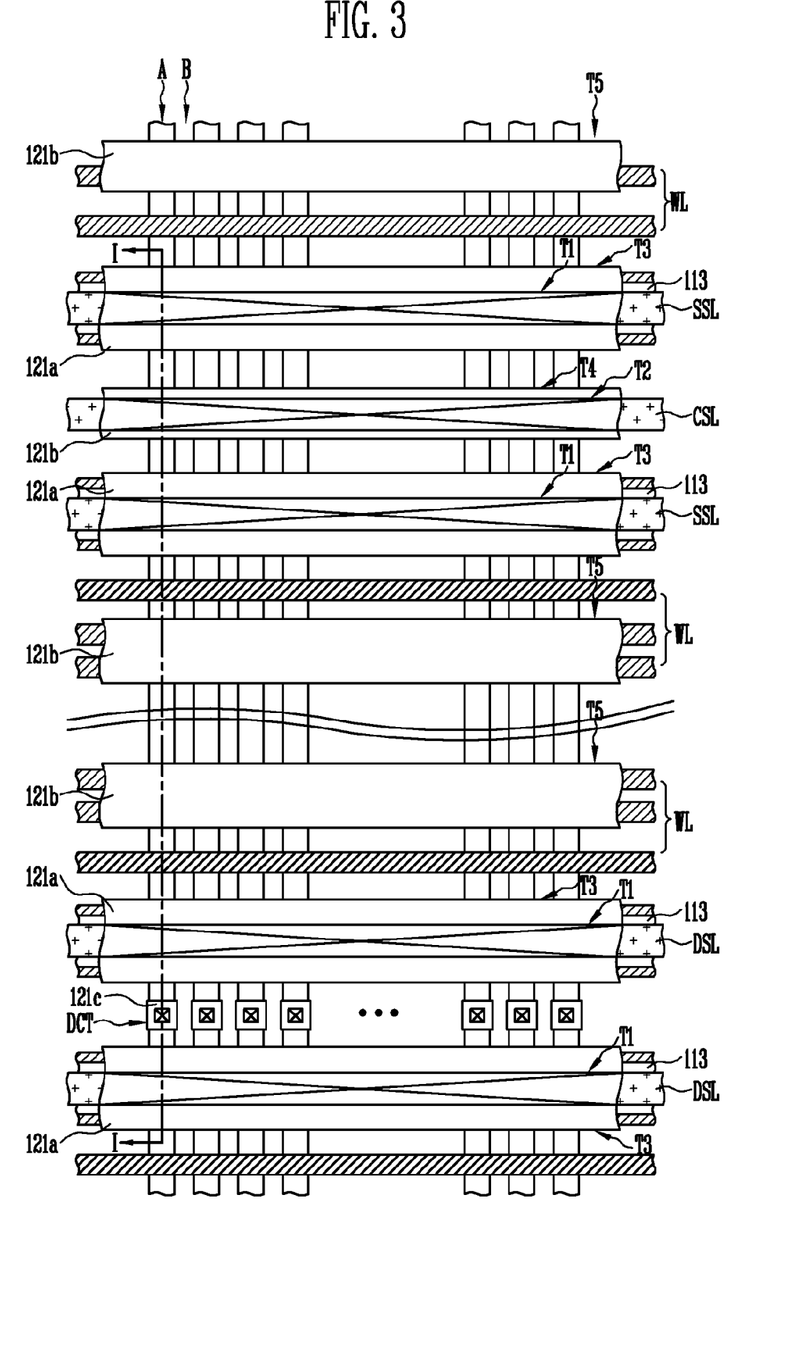
FIG. 3 is a plan view of a NAND flash memory device according to an embodiment of the present invention.
Figure 4:
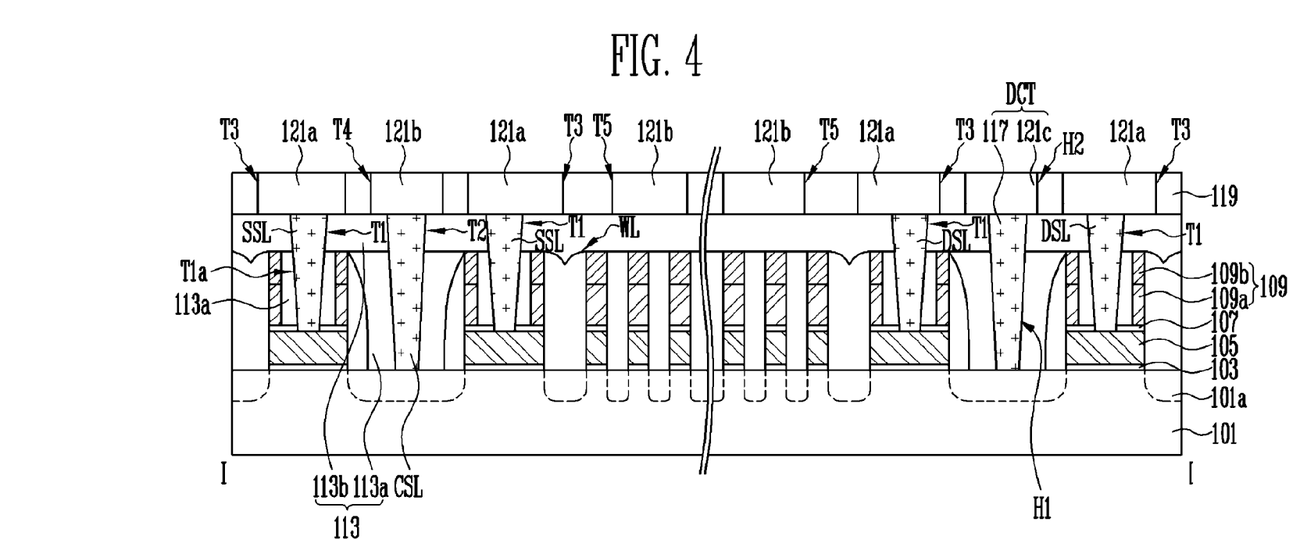
FIG. 4 is a cross-sectional view of the NAND flash memory device taken along line I-I in FIG. 3.

FIGS. 3-4 illustrates a NAND flash memory device according to an embodiment of the present invention. In particular, FIG. 3 is a plan view of the NAND flash memory device according to an embodiment of the present invention, and FIG. 4 is a cross-sectional view of the NAND flash memory device taken along the line I-I in FIG. 3. Furthermore, FIGS. 3-4 show the cell array region of the NAND flash memory device.

Referring to FIGS. 3-4, the cell array region of the NAND flash memory device according to an embodiment of the present invention includes the select lines including the drain select lines DSL and the source select lines SSL and the word lines WL formed between the drain select lines DSL and the source select lines SSL. The arrangement comprising the source select lines SSL, the drain select lines DSL, and the word lines WL can be repeated on the basis of a common source line CSL or a drain contact DCT.

Accordingly, the two source select lines SSL are formed along both sides of the common source line CSL, and the two drain select lines DSL are formed with the drain contact DCTs interposed therebetween, all of which are shown in FIG. 3.

Furthermore, the drain select transistor coupled to the drain select lines DSL, the source select transistor coupled to the source select lines SSL, and the memory cells coupled to the word lines WL are coupled in series through junctions 101a (see FIG. 4) formed in a semiconductor substrate 101 within respective active regions A.

The source select lines SSL, the word lines WL, the drain select lines DSL, and the common source line CSL are formed in parallel with respect to each other, and they cross the active regions A and the isolation structure B of the semiconductor substrate 101 as shown in FIG. 3. The active regions A of the semiconductor substrate 101 are separated from each other by the isolation structure B. The isolation structure B may be formed by etching the semiconductor substrate 101 to a certain depth and then filling the etched part of semiconductor substrate 101 with an insulating material.

Referring to FIG. 4, a gate insulating layer 103 and a first conductive layer pattern 105 are formed in the active regions A of the semiconductor substrate 101. The first conductive layer pattern 105 is used as the gates of the select transistors and the memory cells.

The first conductive layer pattern 105 for memory cells under the word lines WL may be used as the floating gates for storing charges. The first conductive layer pattern 105 for the select transistors under the source and drain select lines DSL, SSL may be used as the gates of the select transistor. The first conductive layer pattern 105 may be made of polysilicon or other material comparable to polysilicon in characteristics.

The edge word lines, which are those word lines next to either a source select line SSL or a drain select line DSL among the plurality of word lines WL, may be used as the pass word lines for preventing the disturbances. The first conductive layer patterns 105 under the pass word lines are used as dummy patterns, and not as a charge trap layer.

A dielectric layer 107 is formed on the first conductive layer pattern 105. The dielectric layer 107 is formed not only over the first conductive layer pattern 105 but also on the isolation structure B along a direction, in which the word lines WL are formed.

A second conductive layer pattern 109 crossing the active regions A is formed on the dielectric layer 107. The second conductive layer pattern 109 may have a stack structure of a polysilicon layer 109a and a metal silicide layer 109b. The metal silicide layer 109b may be a cobalt silicide ($CoSi_2$) layer or a nickel silicide (NiSi) having lower resistance than the polysilicon layer 109a, and may be formed by the silidation process.

Certain parts of the second conductive layer pattern 109 become the word lines WL, and the other remaining parts thereof become the dummy patterns.

The second conductive layer pattern 109 as the dummy patterns remains on the sidewalls of recess regions T1a. The recess regions T1a may be formed to expose a part of the dielectric layer 107 on the first conductive layer pattern 105, and the recess regions T1a may be formed in a line form parallel along the word lines WL or may be formed as a plurality of holes, which are arranged in parallel along the word lines WL. The inside of each recess region T1a is filled with a first interlayer dielectric layer 113.

The first interlayer dielectric layer 113 may include first and second insulating layers 113a, 113b. The first insulating layer 113a is formed within the recess regions T1a and on the junctions 101a, after a polishing process is performed to expose a polysilicon layer when the silidation process is performed. The second insulating layer 113b is formed over the second conductive layer pattern 109 and the first insulating layer 113a in order to insulate the upper lines such as the word lines WL and the auxiliary lines.

The parts of the first conductive layer pattern 105 for select transistors are exposed through the first trenches T1. The first trench T1 penetrates the first interlayer dielectric layer 113 and the dielectric layer 107 at the bottom of the recess region T1a. The source select lines SSL and the drain select lines DSL are formed within the first trench T1.

Accordingly, the select lines including the source and drain select lines SSL, DSL are electrically coupled to the first conductive layer pattern 105 for select transistor. Accordingly, the first conductive layer pattern 105 that are for select transistors does not store data but is used as the gates of the select transistors.

The source select lines SSL and the drain select lines DSL may be made of the same material as the drain contact plug 117 of the common source line CSL and the drain contact DCT. The common source line CSL is formed to expose the junction 101a and the isolation structure B between the source select lines SSL through the first interlayer dielectric layer 113. The common source line CSL is formed within a second trench T2 crossing the active regions A. Accordingly, the common source line CSL is coupled to the junction 101a of the source select transistor between the source select lines SSL and formed to cross the active regions A.

Furthermore, the drain contact plug 117 is formed within a drain contact hole H1. The drain contact hole H1 exposes the junction 101a formed in the active region A between the drain select lines DSL through the first interlayer dielectric layer 113. Accordingly, the drain contact plug 117 is coupled to the junction 101a of the drain select transistor between the drain select lines DSL.

The source select lines SSL, the drain select lines DSL, the common source line CSL, and the drain contact plug 117 are formed of a metal layer having lower resistance than the second conductive layer pattern 109. For example, the source select lines SSL, the drain select lines DSL, the common source line CSL, and the drain contact plug 117 may be made of tungsten (W), cobalt (Co), or nickel (Ni).

Alternatively, the source select lines SSL, the drain select lines DSL, the common source line CSL, and the drain contact plug 117 may be formed of a metal silicide layer having lower resistance than the second conductive layer pattern 109. According to an embodiment of the present invention, the resistances of the source select lines SSL and the drain select lines DSL are improved because the source select lines SSL and the drain select lines DSL are made of a metal having low resistance as described above.

The source select lines SSL and the drain select lines DSL are coupled to the first auxiliary lines 121a, thereby further improving the resistances of the source select lines SSL and the drain select lines DSL. This is because the first auxiliary lines 121a (as well as the second auxiliary lines 121b for improving resistance of the common source line CSL and the drain contact pad 121c of the drain contact DCT) may be made of a metal such as tungsten (W), cobalt (Co), or nickel (Ni) having a lower resistance than the second conductive layer pattern 109 or made of a metal silicide layer having a lower resistance than the second conductive layer pattern 109.

The first auxiliary line 121a is formed within third trenches T3 parallel to the source select lines SSL or the drain select lines DSL. The third trenches T3 penetrate a second interlayer dielectric layer 119 and expose the source select lines SSL or the drain select lines DSL. The third trench T3 may have a wider width than the source select line SSL or the drain select line DSL.

The second auxiliary line 121b is formed within the fourth trench T4 parallel to the common source line CSL and within the fifth trenches T5 parallel to the word lines WL. The fourth trenches T4 expose the common source line CSL through the second interlayer dielectric layer 119, and the fifth trenches T5 expose the first interlayer dielectric layer 113 through the second interlayer dielectric layer 119. The fifth trench T5 may have a wider width than the word line WL.

The drain contact pad 121c is formed within a drain pad hole H2, exposing the drain contact plug 117 through the second interlayer dielectric layer 119. The drain pad hole H2 may have a wider width than the drain contact hole H1. Accordingly, the drain contact pad 121c is coupled to the junction 101a between the drain select lines DSL via the drain contact plug 117.

Although not shown, the third to fifth trenches T3, T4, T5 may be separated from each other with the strapping region of the semiconductor substrate 101 interposed therebetween. In this case, the auxiliary lines formed within the third to fifth trenches T3, T4, T5 may be electrically coupled to each other using an additional contact structure provided in the strapping region, if necessary. As described above, the NAND flash memory device according to an embodiment of the present invention can improve the resistance of the source and drain select lines SSL, DSL, because the source and drain select lines SSL, DSL are made of a material having lower resistance than the second conductive layer pattern for the word lines WL.

FIGS. 5A-5H are cross-sectional views drawn to illustrate a method of manufacturing the NAND flash memory device according to an embodiment of the present invention as shown in FIGS. 3-4. In particular, FIGS. 5A to 5H are cross-sectional views taken along line I-I in FIG. 3.

Figure 5A:
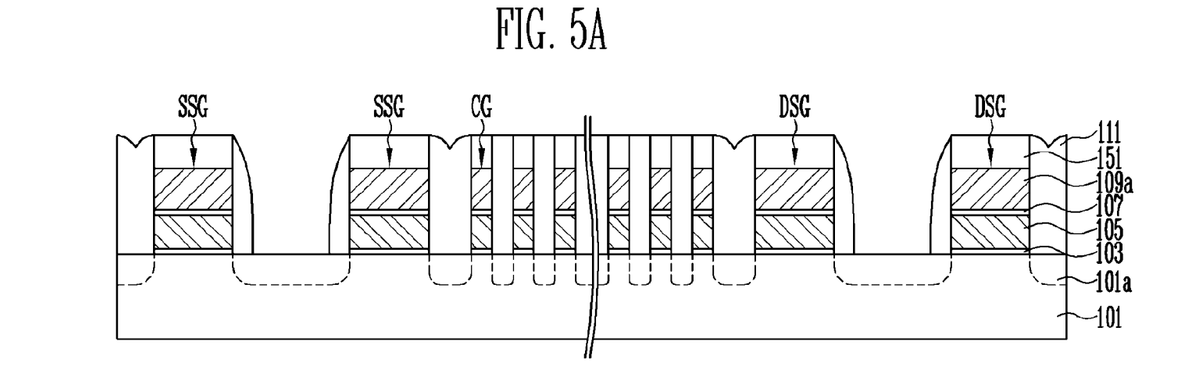
FIGS. 5A to 5H are cross-sectional views for illustrating a method of manufacturing the NAND flash memory device according to an embodiment of this disclosure.

Referring to FIG. 5A, a plurality of gate patterns SSG, CG, DSG is formed over the gate insulating layer 103 over the semiconductor substrate 101. Each of the gate patterns SSG, CG, DSG has the stack structure of the first conductive layer pattern 105, the dielectric layer 107, and the polysilicon layer 109a of the second conductive layer pattern.

Next, the junctions 101a are formed by implanting impurity ions into the semiconductor substrate 101 between the gate patterns SSG, CG, DSG. The junctions 101a include the junction of a source select transistor SST used as the source of a string ST, the junction of a drain select transistor DST used as the drain of the string ST, and junctions coupling memory cells MC forming the string MC.

The gate insulating layer 103 is formed of an oxide layer and may be formed by an oxidization process. The gate insulating layer 103 formed by the oxidization process may be formed of a silicon oxide ($SiO_2$) layer.

The gate patterns SSG, CG, DSG include a source select gate SSG, cell gates CG, and a drain select gate DSG. The cell gates CG are more densely formed than the source and drain select gates SSG, DSG.

An example of a process of forming the gate patterns SSG, CG, DSG is described in more detail below. First, a first conductive layer is formed over the gate insulating layer 103. The first conductive layer may be formed of a polysilicon layer. The first conductive layer is used as a floating gate (that is, the charge trap layer of the cell gate) or the gates of the source and drain select transistors SST, DST.

An isolation hard mask pattern (not shown) is formed over the first conductive layer. Isolation trenches (not shown) are formed in the semiconductor substrate 101 by etching the first conductive layer, the gate insulating layer 103, and the semiconductor substrate 101 using the isolation hard mask pattern as an etch barrier.

Next, isolation layers (not shown) are formed by filling the isolation trenches with insulating material, thereby completing the isolation structures. Regions of the semiconductor substrate 101 in which the isolation structures are not formed are defined as the active regions. Accordingly, the gate insulating layer 103 and the first conductive layer remain over the active regions.

Next, the isolation hard mask pattern is removed. Next, the dielectric layer 107 is formed on the first conductive layer and on the isolation structures. The dielectric layer 107 may have an ONO structure in which an oxide layer, a nitride layer, and an oxide layer are stacked. The thickness of the dielectric layer 107 may be controlled so that a space between the sidewalls of the first conductive layer is not filled.

Next, the polysilicon layer 109a is formed over the dielectric layer 107, and a gate hard mask pattern 151 is formed over the polysilicon layer 109a.

As described above, a process of forming contact holes in the dielectric layer 107 may be performed after forming the polysilicon layer 109a. By not forming the dielectric layer 107 before forming the polysilicon layer 109a, there is no need to form a capping layer, which functions as a passivation layer in the process of forming the contact holes in the dielectric layer 107, before forming the polysilicon layer 109a.

The gate hard mask pattern 151 defines the regions in which the word lines WL, the source select lines SSL, and the drain select lines DSL will be formed. The gate hard mask pattern 151 may be formed of an oxide layer or a stack structure of a nitride layer and an oxide layer.

The polysilicon layer 109a, the dielectric layer 107, and the first conductive layer 105 are etched using the gate hard mask pattern 151 as an etch barrier until the gate insulating layer 103 is exposed. Accordingly, the gate patterns SSG, CG, DSG (each of which having the stacked layers of the first conductive layer pattern 105, the dielectric layer 107, and the polysilicon layer 109a) are formed.

The first conductive layer pattern 105 of the cell gate CG is used as the floating gate of the memory cell. The first conductive layer pattern 105 of the source and drain select gates SSG, DSG is used as the gate of the select transistor SST, DST. The gate insulating layer 103 may also be etched in an etch process using the gate hard mask pattern 151 as an etch barrier.

A spacer layer may be further formed over the semiconductor substrate 101 where the gate patterns SSG, CG, DSG and the junctions 101a are formed. The thickness of the spacer layer may be controlled so that a space between the neighboring source select gates SSG and a space between the neighboring drain select gates DSG are not filled in completely, but the spacer layer is etched until the semiconductor substrate 101 is exposed using an etch-back etch process.

Accordingly, the spacer layer remains as a spacer 111 on the sidewalls of the gate patterns SSG, CG, DSG. A space between the neighboring cell gates CG may be filled with the spacer 111 because the cell gates CG are more densely formed than the source and the drain select gates SSG, DSG.

Meanwhile, the etch process for forming the gate patterns SSG, CG, DSG includes a process using the dielectric layer 107 as an etch-stop layer based on a difference in the etch selectivity in order to prevent the semiconductor substrate 101 from being damaged.

If the etch process for forming the gate patterns SSG, CG, DSG is performed after the contact holes are formed in the dielectric layer 107, the contact holes of the dielectric layer 107 may be formed in the portions where the dielectric layer 107 must remain as an etch-stop layer owing to an alignment error.

Furthermore, the underlying layer may be excessively etched and even the semiconductor substrate 101 may be damaged because the dielectric layer 107 does not remain as the etch-stop layer in specific portions in the gate patterning process. If the gate patterns SSG, CG, DSG are patterned after the contact holes are formed in the dielectric layer 107, there is a limitation on a reduction in the width of each of the source select line and the drain select line because the contact holes formed in the dielectric layer 107 must have an alignment margin.

In an embodiment of the present invention, however, there is no problem that the dielectric layer 107 is used the etch-stop layer in the etch process for forming the gate patterns SSG, CG, DSG because the etch process for forming the gate patterns SSG, CG, DSG is performed in the state in which the contact holes have not been formed in the dielectric layer 107. Accordingly, in this disclosure, damage to the semiconductor substrate 101 can be improved by using the dielectric layer 107 as the etch-stop layer in the etch process for forming the gate patterns SSG, CG, DSG.

Furthermore, more highly integrated memory devices can be manufactured because it is not necessary to limit the width of each of the source select line SSL and the drain select line SSL in order to secure the alignment margin of the dielectric layer contact holes formed before the gate patterns SSG, CG, DSG are formed.

Figure 5B:
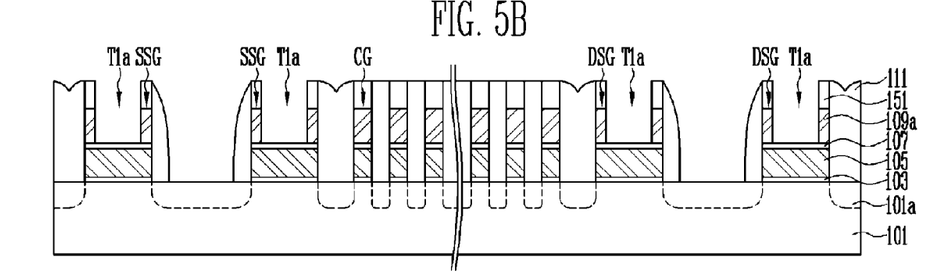

Referring to FIG. 5B, the dielectric layer is exposed by etching the polysilicon layer 109a over the first conductive layer pattern 105 for select transistors.

More particularly, the recess regions T1a through which the dielectric layer 107 of the source select gates SSG and the drain select gates DSG are exposed are formed by etching the polysilicon layer 109a of the source select gates SSG and the drain select gates DSG. The width of each of the recess regions T1a may be narrower than the width of the first conductive layer pattern 105.

The recess regions T1a are formed using a mask process for forming a gate contact hole in the driving gate of a peripheral region. Accordingly, although the recess regions T1a are formed, a mask process is not added.

Figure 6:
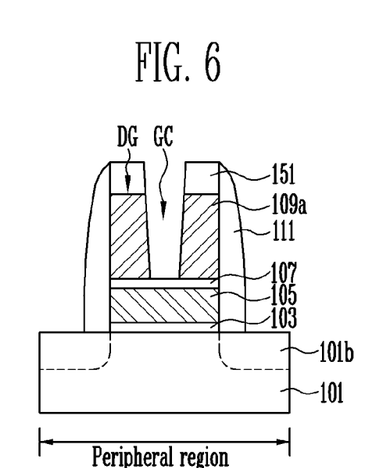
FIG. 6 is a cross-sectional view illustrating part of a peripheral region of the NAND flash memory device.

Now referring to FIG. 6, shown therein is a cross-sectional view illustrating a part of a peripheral region where the circuit elements for driving the memory cells of the cell array region are formed.

Referring to FIG. 6, like a memory cell array region, the driving gate G for driving the circuit elements of the peripheral region includes the first conductive layer pattern 105, the dielectric layer 107, and the polysilicon layer 109a which are stacked over the gate insulating layer 103 over the semiconductor substrate 101.

The first conductive layer pattern 105, the dielectric layer 107, and the polysilicon layer 109a of the peripheral region are patterned by using a gate hard mask pattern 151 where the driving gate G will be formed as an etch barrier. The spacer 111 is also formed on the sidewalls of the driving gate DG. The junction 101b is formed in the semiconductor substrate 101 on both sides of the driving gate DG and is used as the source or drain of the driving gate DG.

The first conductive layer pattern 105 of the driving gate DG is not used as a floating gate. Accordingly, the first conductive layer pattern 105 and the polysilicon layer pattern 109a of the driving gate DG must be electrically coupled. In order to form a contact structure for electrically coupling the first conductive layer 105 and the polysilicon layer 109a of the driving gate DG, the gate contact hole GC exposes the dielectric layer 107 through the gate hard mask pattern 151 and the polysilicon layer 109a.

In a subsequent process, the dielectric layer 107 exposed through the gate contact hole GC is removed, and portions from which the gate contact hole GC and the dielectric layer 107 have been removed is filled with conductive material. Accordingly, the first conductive layer pattern 105 and the polysilicon layer 109a of the driving gate DG can be electrically coupled.

Now referring back to FIG. 5C, the space between the source select gates SSG, the space between the drain select gates DSG, and the recess regions T1a are filled with the first insulating layer 113a. The first insulating layer 113a used as the first interlayer dielectric layer may be formed higher than a top surface of the polysilicon layer 109a and then polished to expose the polysilicon layer 109a. In this case, a metal layer 155 to be subsequently formed comes into contact with a polysilicon layer 109a so that the silidation process can be performed.

Figure 5C:
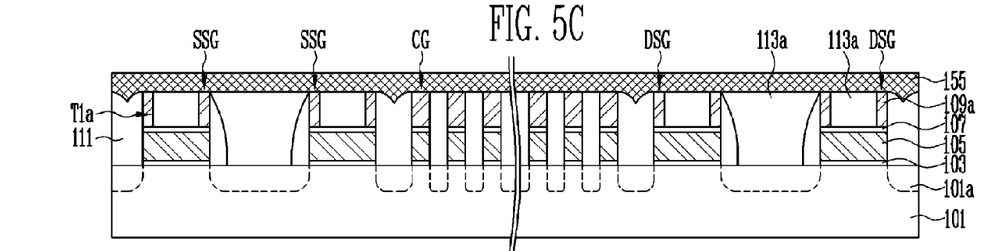

The metal layer 155 formed after the first insulating layer 113a is polished is for silidation. The metal layer 155 may be formed of a cobalt layer or a nickel layer in order to form the cobalt silicide ($CoSi_2$) layer or the nickel silicide (NiSi) layer having low resistance.

Figure 5D:
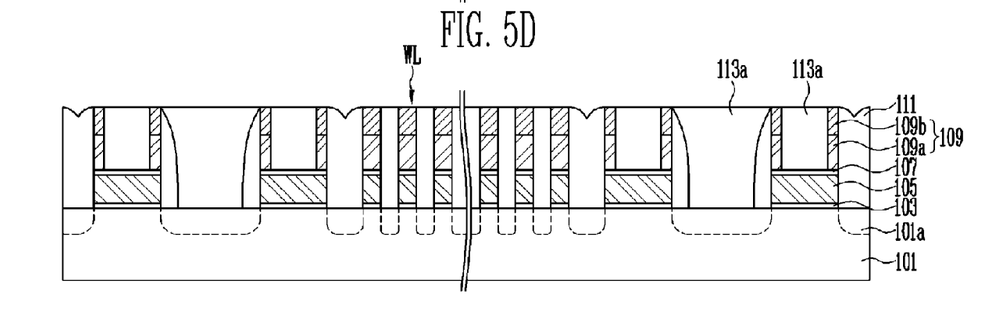

Referring to FIG. 5D, the silidation process is performed which includes a primary annealing process of diffusing metal from the metal layer to the polysilicon layer, a process of removing the metal layer remained after the primary annealing process, and a secondary annealing process for forming the metal silicide layer 109b having low resistance.

Accordingly, an upper portion of the polysilicon layer is transformed into the metal silicide layer 109b, thus forming the second conductive layer pattern 109 having the stack structure of the polysilicon layer 109a and the metal silicide layer 109b. A part of the second conductive layer pattern 109, formed over the first conductive layer pattern 105 for memory cells, becomes the word lines WL. A part of the second conductive layer pattern 109, formed over the first conductive layer pattern 105 for a select transistor, becomes the dummy patterns.

Figure 5E:
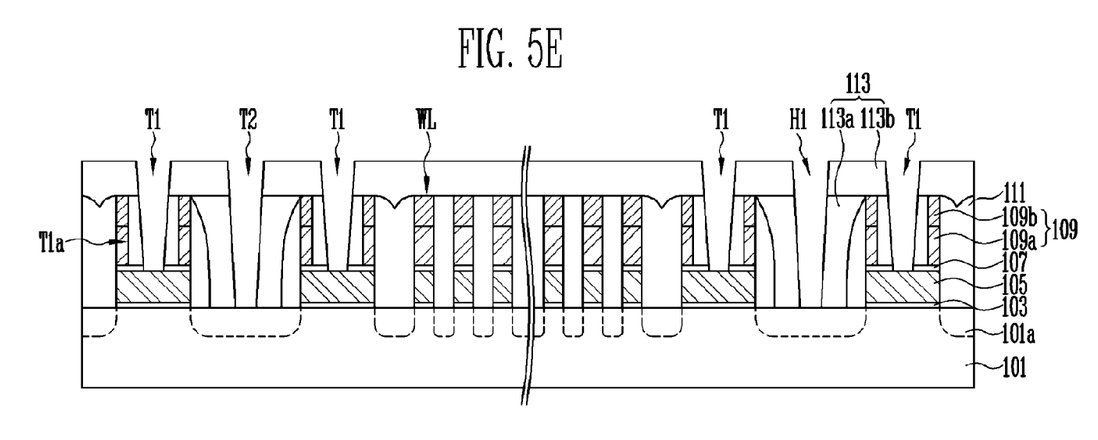

Referring to FIG. 5E, the second insulating layer 113b is formed over the semiconductor substrate 101 in which the metal silicide layer 109b is formed and is used as first interlayer dielectric layer 113. The second insulating layer 113b may be made of the same material as the first insulating layer 113a and may be formed of, for example, an oxide layer.

After the first interlayer dielectric layer 113 including the first and the second insulating layers 113a and 113b is formed, the first and the second trenches T1, T2 and the drain contact holes H1 are formed by etching part of the first interlayer dielectric layer 113 and a part of the dielectric layer 107. The first and the second trenches T1, T2 and the drain contact holes H1 may be formed by etching the first interlayer dielectric layer 113 and the dielectric layer 107 using a hard mask pattern as an etch barrier and then removing the hard mask pattern.

The first trenches T1 are formed by removing the second insulating layer 113b over the recess regions, the first insulating layer 113a within the recess regions, and the dielectric layer 107 at the bottoms of the recess regions. Accordingly, the first conductive layer pattern 105 for a select transistor is exposed through the first trench T1. Here, the first insulating layer 113a may partially remain on the sidewalls of the first trenches T1.

The second trenches T2 are formed by removing the first and the second insulating layers 113a, 113b between the source select lines SSL so that the junction 101a between the neighboring source select lines SSL is exposed.

The drain contact holes H1 are formed by removing the first and the second insulating layers 113a and 113b between the drain select lines DSL so that the junction 101a between the neighboring drain select lines DSL is exposed.

Figure 5F:
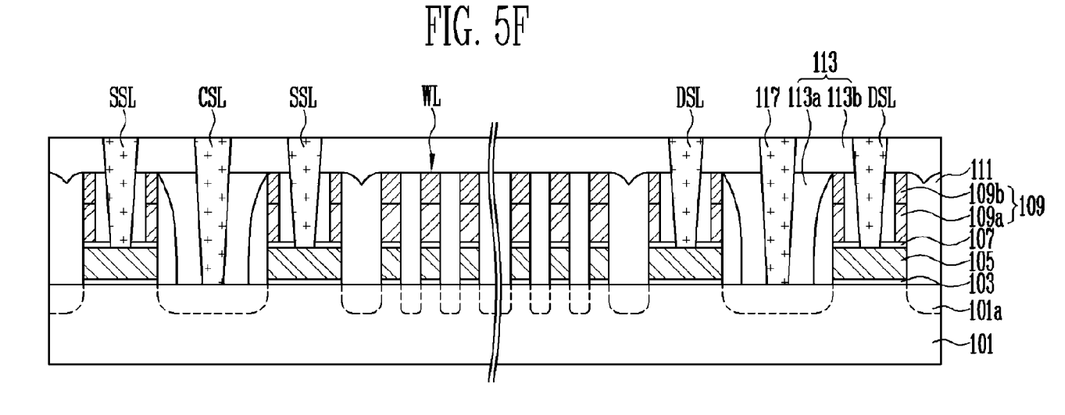

Referring to FIG. 5F, the source select lines SSL, the drain select lines DSL, the common source line CSL, and the drain contact plug 117 are formed by filling the first and the second trenches T1, T2 and the drain contact holes H1 with metal having a low resistance, such as tungsten (W). The source select lines SSL, the drain select lines DSL, the common source line CSL, and the drain contact plug 117 may be formed by forming a metal layer higher than a surface of the first interlayer dielectric layer 113 and then polishing the metal layer so that the first interlayer dielectric layer 113 is exposed.

Figure 5G:
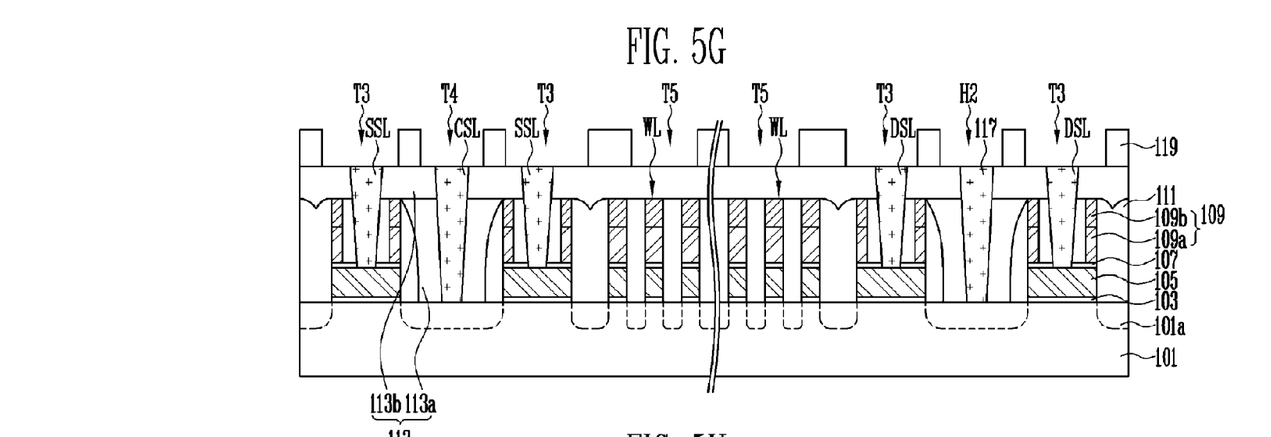

Referring to FIG. 5G, the second interlayer dielectric layer 119 is formed over the semiconductor substrate 101 in which the source select lines SSL, the drain select lines DSL, the common source line CSL, and the drain contact plug 117 are formed. The second interlayer dielectric layer 119 may be formed of an oxide layer.

Next, the third to fifth trenches T3, T4, T5 and the drain pad hole H2 are formed by etching part of the second interlayer dielectric layer 119. The third to fifth trenches T3, T4, T5 and the drain pad hole H2 may be formed by etching the second interlayer dielectric layer 119 using a hard mask pattern as an etch barrier and then removing the hard mask pattern.

The third trenches T3 are formed by removing the second interlayer dielectric layer 119 over the source select lines SSL and the drain select lines DSL. Accordingly, the source select lines SSL and the drain select lines DSL are exposed through the third trenches T3.

The fourth trench T4 is formed by removing the second interlayer dielectric layer 119 over the common source line CSL. Accordingly, the common source line CSL is exposed through the fourth trench T4.

The fifth trench T5 is formed by removing the second interlayer dielectric layer 119 over the word lines WL. Accordingly, the first interlayer dielectric layer 113 is exposed through the fifth trench T5.

The drain pad hole H2 is formed by removing the second interlayer dielectric layer 119 over the drain contact plug 117. Accordingly, the drain contact plug 117 is exposed through the drain pad hole H2.

Figure 5H:
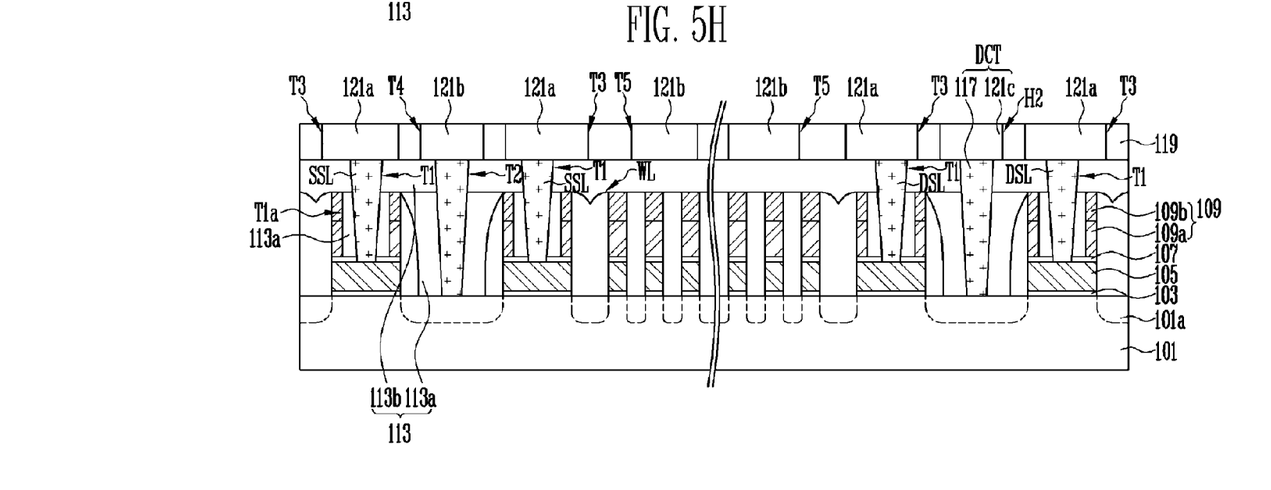

Referring to FIG. 5H, the first and the second auxiliary lines 121a, 121b and the drain contact pad 121c are formed by filling the third to fifth trenches T3, T4, T5 and the drain pad hole H2 with metal having low resistance, such as tungsten (W), cobalt (Co), or nickel (Ni), or a conductive layer formed of a metal silicide layer having lower resistance than the second conductive layer pattern 109. The first auxiliary lines 121a, the second auxiliary lines 121b, and the drain contact pad 121c may be formed by forming the metal layer higher than a surface of the second interlayer dielectric layer 119 and then polishing the conductive layer to expose the second interlayer dielectric layer 119.

As described above, according to an embodiment of the present invention, the patterning of the gate patterns is completed before the trenches are formed in the dielectric layer. Accordingly, a problem that the dielectric layer in some region does not play the role of an etch-stop layer when the gate patterns are patterned can be fundamentally prevented.

Furthermore, resistance of select lines, including the source select lines SSL and the drain select line DSL, can be improved because the select lines are made of material having lower resistance than the conductive layer pattern for the word lines. In addition, a manufacturing process can be simplified and production costs can be reduced because a process of forming the contact holes in the dielectric layer can be omitted before the conductive layers, such as the polysilicon layer, are formed over the dielectric layer.

Figure 7:
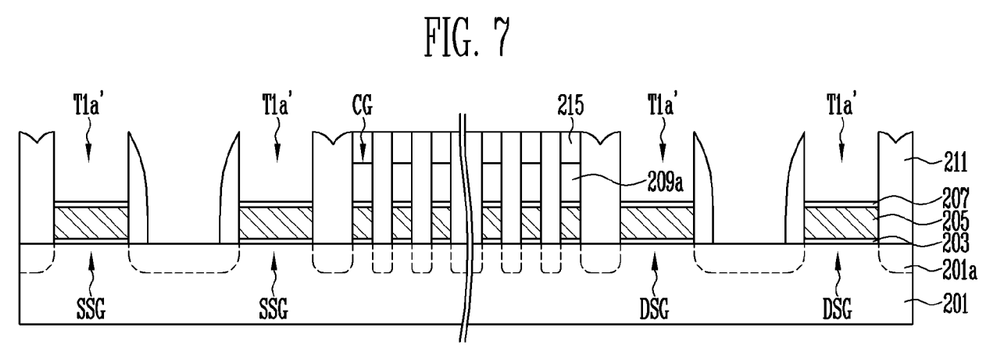
FIG. 7 is a cross-sectional view illustrating a NAND flash memory device and a method of manufacturing the same according to another embodiment of this disclosure.

FIG. 7 are cross-sectional views illustrating a NAND flash memory device and a method of manufacturing the same according to another embodiment of this disclosure.

In the NAND flash memory device according to an embodiment of the present invention as shown in FIG. 7, when recess regions T1a' are formed, a polysilicon layer 209a does not remain as dummy patterns in some of the recess regions T1a'. Here, not only a dielectric layer 207, but also a spacer 211 may be used as an etch-stop layer. In this case, the width of the recess region T1' becomes equal to the width of a first conductive layer pattern 205 for select transistors. Accordingly, the dielectric layer 207 formed over the first conductive layer pattern 205 is exposed in the same with as the first conductive layer pattern 205.

In an embodiment of the present invention as shown in FIG. 7, processes performed before the recess regions T1a' are formed are the same as those of the first embodiment of this disclosure. More particularly, a process of forming the gate patterns SSG, DSG, CG in which the first conductive layer pattern 205, the dielectric layer 207, and the polysilicon layer 209a are stacked over a gate insulating layer 203 using the gate hard mask pattern 215 as an etch barrier, a process of forming junctions 201a, and a process of forming the spacer 211 are the same as those shown in FIGS. 3-4 and 5A-5H, and a description thereof is omitted for simplicity. The gate insulating layer 203 is formed on a semiconductor substrate 201.

Furthermore, in an embodiment as shown in FIG. 7, processes performed after the recess regions T1a' are formed are the same as those shown in FIGS. 3-4 and 5A-5H of this disclosure, and a description thereof is omitted for simplicity.

According to embodiments of the present invention as described above, resistance of select lines including the source select lines SSL and the drain select lines DSL can be improved because the select lines are made of material having lower resistance than the conductive layer pattern for the word lines WL.

Furthermore, a contact structure for electrically coupling the select lines and the first conductive layer is formed by a process of forming a gate contact structure in the peripheral region. Accordingly, an additional mask process for forming the contact holes in the dielectric layer so as to electrically couple the select lines and the first conductive layer needs not to be performed. Accordingly, a manufacturing process can be simplified, and production costs can be reduced.

In addition, after the gate patterns are patterned, the dielectric layer is etched. Accordingly, a problem that even the semiconductor substrate is exposed and damaged through the contact holes formed in the dielectric layer in a process of patterning the gate patterns owing to an alignment error in the contact holes can be fundamentally prevented. Consequently, the width of the select line can be sufficiently narrowed because there is no limitation on a reduction in the width of the select line by taking the alignment margin of the contact holes into account.

What is claimed is:

1. A semiconductor memory device, comprising:
   a gate insulating layer formed over first and second areas of a semiconductor substrate, wherein the first area is for forming a select transistor and the second area is for forming a memory cell;
   a first conductive pattern for the select transistor formed over the gate insulating layer over the first area;
   a first dielectric pattern formed over the first conductive pattern over the first area;
   a second conductive pattern for a dummy pattern formed on the first dielectric pattern; and
   a select line having a lower resistance than the second conductive pattern, separated from the second conductive pattern and coupled to the first conductive pattern.

2. The semiconductor memory device of claim 1, further comprising a first interlayer dielectric layer between the select line and the second conductive pattern formed in the first area.

3. The semiconductor memory device of claim 1, further comprising a spacer formed on sidewalls of the first conductive pattern, the first dielectric pattern, and the second conductive pattern in the first area.

4. The semiconductor memory device of claim 1, further comprising an auxiliary line having a lower resistance than the second conductive pattern and coupled to the select line.

5. The semiconductor memory device of claim 4, wherein the auxiliary line is formed of metal.

6. The semiconductor memory device of claim 4, wherein the auxiliary line comprises tungsten (W), cobalt (Co), or nickel (Ni) or a metal silicide layer.

7. The semiconductor memory device of claim 1, wherein the second conductive pattern has a stack structure of a polysilicon layer and a metal silicide layer.

8. The semiconductor memory device of claim 1, wherein the select line comprises metal.

9. The semiconductor memory device of claim 1, further comprising:
   junctions of the select transistor formed in the first area of the semiconductor substrate; and
   a common source line coupled to the junctions, wherein the select line is made of substantially the same material as the common source line.

10. The semiconductor memory device of claim 1, further comprising:
    a third conductive pattern for the memory cell formed over the gate insulating layer over the second area, wherein the third conductive pattern is made of substantially the same material as the first conductive pattern;
    a second dielectric pattern formed over the third conductive pattern and made of substantially the same material as the first dielectric pattern; and
    a fourth conductive pattern for a word line on the second dielectric pattern and made of substantially the same material as the second conductive pattern.

* * * * *